US012609441B2

(12) United States Patent
Jiang et al.

(10) Patent No.: US 12,609,441 B2
(45) Date of Patent: Apr. 21, 2026

(54) ANTENNAS HAVING SUBSTRATE LAYERS WITH COMPOUND CURVATURE

(71) Applicant: Apple Inc., Cupertino, CA (US)

(72) Inventors: Yi Jiang, Cupertino, CA (US); Boon W Shiu, Palo Alto, CA (US); Jason C Sauers, Sunnyvale, CA (US); Jia-Woei Chen, Campbell, CA (US); Killian J Poore, San Jose, CA (US); Lijun Zhang, Los Gatos, CA (US)

( * ) Notice: Subject to any disclaimer, the term of this patent is extended or adjusted under 35 U.S.C. 154(b) by 15 days.

(21) Appl. No.: 18/440,106

(22) Filed: Feb. 13, 2024

(65) Prior Publication Data

US 2024/0186686 A1 Jun. 6, 2024

Related U.S. Application Data

(63) Continuation of application No. PCT/US2022/040812, filed on Aug. 18, 2022.

(Continued)

(51) Int. Cl.
*H01Q 1/27* (2006.01)
*G06F 1/16* (2006.01)
(Continued)

(52) U.S. Cl.
CPC ............. *H01Q 1/273* (2013.01); *G06F 1/163* (2013.01); *G06F 1/1698* (2013.01); *H01Q 1/38* (2013.01);
(Continued)

(58) Field of Classification Search
CPC ...... A01K 47/00; B23D 63/12; B29C 45/581; C08L 75/04; C09D 5/34; D01B 1/22;
(Continued)

(56) References Cited

U.S. PATENT DOCUMENTS 6,603,430 B1 * 8/2003 Hill .......................... H01Q 9/42
343/702
7,289,068 B2 10/2007 Fujio et al.
(Continued)

FOREIGN PATENT DOCUMENTS

CN 208805616 U 4/2019
JP 2012019064 A 1/2012
WO 2021132181 A1 7/2021

*Primary Examiner* — Thien M Le
(74) *Attorney, Agent, or Firm* — Treyz Law Group, P.C.; Tianyi He

(57) ABSTRACT

A head-mounted device may have a head-mounted housing that is configured to be worn on a head of a user. While the head-mounted device is being worn, optical modules in the head-mounted device may provide images to eye boxes located rearward of the head-mounted device. A forward-facing display on a front portion of the head-mounted device may be covered with a transparent housing portion forming a display cover layer. An antenna may be mounted in the device. A curved portion of the display cover layer or other dielectric housing layer may overlap the antenna. The antenna and/or other components may be formed by contouring a flexible printed circuit into a shape characterized by a surface with compound curvature. The contoured flexible printed circuit may have polymer layers and a metal trace between the polymer layers. A neutral stress plane may be aligned with the metal trace.

20 Claims, 7 Drawing Sheets

Related U.S. Application Data

(60) Provisional application No. 63/240,179, filed on Sep. 2, 2021.

(51) Int. Cl.
| | | |
|---|---|---|
| *H01Q 1/38* | (2006.01) | |
| *H05K 1/02* | (2006.01) | |
| *H05K 1/03* | (2006.01) | |

(52) U.S. Cl.
CPC ........... *H05K 1/0237* (2013.01); *H05K 1/028* (2013.01); *H05K 1/0313* (2013.01); *H05K 2201/10098* (2013.01); *H05K 2201/10128* (2013.01)

(58) Field of Classification Search
CPC ........... E05B 37/02; F24B 5/02; G01G 19/46; G02B 27/017; G06F 1/163; G06F 1/1698; G10C 3/10; H01Q 1/24; H01Q 1/273; H01Q 1/38; H01Q 9/42; H05K 1/0237; H05K 1/028; H05K 1/0313; H05K 2201/10098; H05K 2201/10128; Y10T 70/7277
See application file for complete search history.

(56) References Cited

U.S. PATENT DOCUMENTS

| | | | | |
|---|---|---|---|---|
| 9,153,856 | B2 | 10/2015 | Rappoport et al. | |
| 9,716,781 | B2 * | 7/2017 | Lee ........................ | H01H 13/02 |
| 10,819,010 | B2 | 10/2020 | Lee et al. | |
| 2007/0264845 | A1 * | 11/2007 | Simonsson ............ | H01R 12/62 |
| | | | | 439/67 |
| 2007/0264879 | A1 * | 11/2007 | Simonsson .......... | H01R 12/714 |
| | | | | 439/729 |
| 2010/0271279 | A1 * | 10/2010 | Johnson ................ | H01Q 1/243 |
| | | | | 343/845 |
| 2014/0111684 | A1 | 4/2014 | Corbin et al. | |
| 2014/0292587 | A1 | 10/2014 | Yarga et al. | |
| 2015/0311960 | A1 | 10/2015 | Samardzija et al. | |
| 2018/0270900 | A1 | 9/2018 | Zhu et al. | |
| 2019/0214709 | A1 | 7/2019 | Frishman et al. | |
| 2021/0089150 | A1 | 3/2021 | Wang et al. | |
| 2022/0239808 | A1 * | 7/2022 | Jang ........................ | G03B 30/00 |
| 2022/0247219 | A1 * | 8/2022 | Shi ........................ | H02J 50/005 |
| 2024/0056520 | A1 * | 2/2024 | Kim ........................ | H01Q 1/246 |
| 2024/0266716 | A1 * | 8/2024 | Kim ..................... | H01Q 21/062 |

* cited by examiner

ANTENNAS HAVING SUBSTRATE LAYERS WITH COMPOUND CURVATURE

This application is a continuation of international patent application No. PCT/US2022/040812, filed Aug. 18, 2022, which claims priority to U.S. provisional patent application No. 63/240,179, filed Sep. 2, 2021, which are hereby incorporated by reference herein in their entireties.

FIELD

This relates generally to electronic devices, and, more particularly, to electronic devices with components such as antennas.

BACKGROUND

Electronic devices such as head-mounted devices and other devices may have input-output components. The input-output components may include components such as antennas for handling wireless communications.

SUMMARY

An electronic device may have housing structures such as dielectric layers with curved surfaces. The curved surfaces may include surfaces with compound curvature. Antennas and other components may be formed from flexible printed circuit substrate layers that have matching compound curvature.

A three-dimensional flexible printed circuit contouring tool may be used to transform a planar sheet of flexible printed circuit material into an antenna or other component with compound curvature. A flexible printed circuit antenna may have a flexible printed circuit substrate layer formed from layers of polymer. The flexible printed circuit antenna may have a metal trace between the layers of polymer that serves as an antenna resonating element (sometimes referred to as an antenna resonating structure or antenna resonator). The contouring tool may be configured to prevent wrinkling of the flexible printed circuit substrate layer during the process of forming the antenna into a desired three-dimensional shape.

DETAILED DESCRIPTION

Electronic devices may be provided with components such as antennas. The electronic devices may include portable electronic devices, wearable devices, desktop devices, embedded systems, and other electronic equipment. Illustrative configurations in which the electronic devices include a head-mounted device may sometimes be described herein as an example.

Antennas may be formed from thin flexible substrates such as flexible printed circuits. A flexible printed circuit may have metal traces that are patterned to form an antenna resonating element (sometimes referred to as an antenna resonating structure or antenna resonator). The metal traces may be supported by a flexible printed circuit substrate layer. The flexible printed circuit substrate layer may be formed from one or more sheets of polyimide or layers of other polymer.

To help conform the antenna to the surface of an electronic device housing layer and/or to otherwise provide the antenna with a shape that facilitates installation and use of the antenna in a device with potentially complex shapes such as surfaces with compound curvature, the antenna substrate may be formed into a three-dimensional shape with a flexible printed circuit contouring tool. The tool may press a planar flexible printed circuit into a desired shape such as a shape with compound curvature, while avoiding undesired contouring artifacts such as wrinkles.

Figure 1:
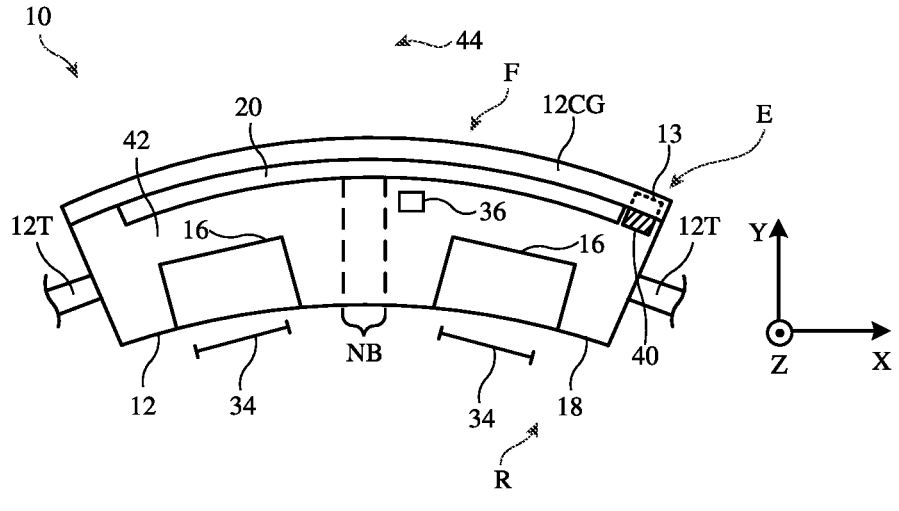
FIG. 1 is a top view of an illustrative electronic device with an antenna in accordance with an embodiment.

FIG. 1 is a top view of an illustrative electronic device that may include a flexible printed circuit antenna such as flexible printed circuit antenna with compound curvature. In the example of FIG. 1, device 10 is a head-mounted device. In general, device 10 may be any suitable electronic equipment.

As shown in FIG. 1, head-mounted device 10 may include housing 12. Housing 12 is configured to be worn on a user's head and may sometimes be referred to as a head-mounted housing or head-mounted support structure. Housing 12 may have curved head-shaped surfaces, a nose-bridge portion such as portion NB that is configured to rest on a user's nose when device 10 is on a user's head, may have a headband such as strap 12T for supporting device 10 on the user's head, and/or may have other features that allow device 10 to be worn by a user. Housing 12 may have walls or other structures that separate an interior region of device 10 such as interior region 42 from an exterior region surrounding device 10 such as exterior region 44. As an example, housing 12 may include a transparent layer that forms a housing wall on front F of device 10 such as display cover layer 12CG. Display cover layer 12CG may overlap a forward-facing display such as display 20 (e.g., a pixel array based on organic light-emitting diodes or other display panel). Portions of display cover layer 12CG such as edge portions of display cover layer 12CG may have curved cross-sectional profiles. As an example, edge portion E of cover layer 12CG may have an inner surface (and, if desired, an outer surface) characterized by compound curvature. If desired, one or more dielectric structures (e.g., a ring-shaped polymer trim member that runs around the periphery of display 20, an overlapping polymer member that forms a canopy that overlaps the ring-shaped polymer member and that overlaps display 20) and/or other dielectric structures (e.g., polymer layers) may be formed in edge portion E (e.g., under display cover layer 12CG). These optional additional dielectric layer(s), which are illustrated as dielectric layer 13 in FIG. 1, may have curved cross-sectional profiles. For example, a dielectric housing layer such as layer 13 (e.g., one or more polymer layers) may be formed in edge portion E under layer 12CG and may have inner and/or outer curved surfaces that match the curvature of the inner surface of display cover layer 12CG in edge portion E).

Device 10 may have one or more antennas. As an example, antenna 40 may be mounted in device 10 under one or more overlapping dielectric layers with curved cross-sectional profiles. As shown in FIG. 1, antenna 40 may, as an example, be mounted under edge portion E of display cover layer 12CG. Antenna 40 may also be mounted under other curved dielectric layers such as under the edge of any polymer layers that are present under display cover layer 12CG, and/or under the edge of any other dielectric layers in device 10. Antenna 40 may be formed from a flexible printed circuit with compound curvature and may be mounted adjacent to a corresponding inner surface of an overlapping dielectric layer having compound curvature. The overlapping dielectric layer may be display cover layer 12CG, may be formed by an overlapping polymer layer under display cover layer 12CG, or may be formed from one or more other dielectric layers (sometimes referred to as housing layer(s)). These overlapping dielectric layer(s) may have inner and/or outer surfaces of compound curvature.

In an illustrative configuration, antenna 40 may be attached to the inner surface of a polymer member with compound curvature (e.g., a polymer member that serves as a carrier) and this polymer member may be subsequently coupled to the inner surface of layer 12CG (e.g., by attaching the carrier to layer 12CG with adhesive or by otherwise securing antenna 40 in a location where antenna 40 is overlapped by edge portion E of layer 12CG). Other mounting arrangements for compound curvature flexible printed circuit antennas may be used, if desired. Moreover, other types of flexible printed circuit structures (e.g., electrodes for a capacitive touch sensor, antenna array structures for radar sensors and other sensors, and/or other flexible printed circuit structures) may be contoured into three-dimensional shapes with compound curvature using a flexible printed circuit contouring tool). The use of a contouring tool to form three-dimensional flexible printed circuit antennas is illustrative.

Device 10 may include electrical components 36 (e.g., integrated circuits, sensors, control circuitry, light-emitting diodes, lasers, and other light-emitting devices, other control circuits and input-output devices, etc.). Components 36 may be mounted on printed circuits and/or other structures within device 10 (e.g., in interior region 42).

To present a user with images for viewing from eye boxes such as eye box 34, device 10 may include rear-facing displays in optical modules 16 (sometimes referred to as optical assemblies). There may be, for example, a left rear-facing display in a left optical module 16 for presenting an image through a left lens to a user's left eye in a left eye box 34 and a right rear-facing display in right optical module 16 for presenting an image through a right lens to a user's right eye in a right eye box 34.

The user's eyes are located in eye boxes 34 at rear R of device 10 when inwardly facing surface 18 of housing 12 rests against the outer surface of the user's face. On rear R, housing 12 may have cushioned structures (sometimes referred to as light seal structures) to enhance user comfort as surface 18 rests against the user's face. Device 10 may have forward-facing components such has forward-facing cameras and other sensors on front F that face outwardly away from the user. These components may generally be oriented in the +Y (forward) direction of FIG. 1.

During operation, device 10 may receive image data (e.g., image data for video, still images, etc.) and may present this information on the displays of optical modules 16. Device 10 may also receive other data, control commands, user input, etc. Device 10 may transmit data to accessories and other electronic equipment. For example, image data from a forward-facing camera may be provided to an associated device, audio output may be provided to a device with speakers such as a headphone device, user input and sensor readings may be transmitted to remote equipment, etc.

Communications such as these may be supported using wired and/or wireless communications. In an illustrative configuration, components 36 may include wireless communications circuitry for supporting wireless communications between device 10 and remote wireless equipment (e.g., a cellular telephone, a wireless base station, a computer, headphones or other accessories, a remote control, peer devices, internet servers, and/or other equipment). Wireless communications may be supported using one or more antennas operating at one or more wireless communications frequencies (see, e.g., antenna 40 of FIG. 1). In an illustrative configuration, one or more antennas may be coupled to wireless transceiver circuitry. The wireless transceiver circuitry may include transmitter circuitry configured to transmit wireless communications signals using the antenna(s) and receiver circuitry configured to receive wireless communications signals using the antenna(s).

The wireless circuitry of device 10 may be formed from one or more integrated circuits, power amplifier circuitry, low-noise input amplifiers, passive RF components, one or more antennas, transmission lines, and other circuitry for handling RF wireless signals. The wireless circuitry may include radio-frequency transceiver circuitry for handling various radio-frequency communications bands. For example, the wireless circuitry of device 10 may include wireless local area network (WLAN) and wireless personal area network (WPAN) transceiver circuitry. This transceiver circuitry may handle 2.4 GHz and 5 GHz bands for WiFi® (IEEE 802.11) communications and other WLAN communications and the 2.4 GHz Bluetooth® communications band or other WPAN bands and may sometimes be referred to herein as WLAN/WPAN transceiver circuitry or local transceiver circuitry.

The wireless circuitry of device 10 may use remote wireless circuitry such as cellular telephone transceiver circuitry for handling wireless communications in frequency ranges (communications bands) such as a cellular low band (LB) from 600 to 960 MHz, a cellular low-midband (LMB) from 1410 to 1510 MHz, a cellular midband (MB) from 1710 to 2170 MHz, a cellular high band (HB) from 2300 to 2700 MHZ, a cellular ultra-high band (UHB) from 3300 to 5000 MHz, or other communications bands between 600 MHz and 5000 MHz. If desired, the cellular telephone transceiver circuitry may support 5G communications using a low band at 600-850 MHz, a mid-band at 2.5-3.7 GHZ, and a high band at 25-39 GHz. Wireless communications may also be provided using other frequency ranges (e.g., frequencies above 100 MHz, above 1 GHz, 1-30 GHz, 100 Mhz-300 GHz, 24 GHz, less than 300 GHz, less than 100 GHz, 10-300 GHz or other mm-wave frequencies, and/or other suitable frequencies). WLAN/WPAN transceiver circuitry and/or cellular transceiver circuitry may handle voice data and non-voice data.

If desired, the antennas and other wireless circuitry of device 10 may include satellite navigation system circuitry such as Global Positioning System (GPS) receiver circuitry for receiving GPS signals at 1575 MHz or for handling other satellite positioning data (e.g., GLONASS signals at 1609 MHZ). Satellite navigation system signals are received from a constellation of satellites orbiting the earth. Wireless circuitry in device 10 can include circuitry for other short-range (local) and long-range (remote) wireless links if desired. For example, wireless circuitry in device 10 may be provided to receive television and radio signals, paging signals, near field communications (NFC) signals at 13.56 MHz or other suitable NFC frequencies, ultrawideband (UWB) signals (e.g., UWB signals from 6-8.5 GHZ, UWB signals from 3.5-9 GHz, etc.). Wireless circuitry in device 10 may also include antennas and transceiver for handling sensing applications (e.g., radar). If desired, antennas may be provided in arrays (e.g., phased antenna arrays) that support beam steering. These arrangements and other arrangements may be used in supporting wireless communications, wireless sensing, wireless location services, wireless power, and other wireless operations.

The wireless circuitry of device 10 may include antennas that are formed using any suitable antenna types. For example, the antennas of device 10 may include antennas with resonating elements (resonators) that are formed from slot antenna structures, loop antenna structures, patch antenna structures, stacked patch antenna structures, antenna structures having parasitic elements, inverted-F antenna structures, planar inverted-F antenna structures, helical antenna structures, monopole antennas, dipole antenna structures, Yagi (Yagi-Uda) antenna structures, surface integrated waveguide structures, coils, hybrids of these designs, etc. If desired, one or more of the antennas may be cavity-backed antennas.

Different types of antennas may be used for different bands and combinations of bands. For example, one type of antenna may be used in forming a local wireless link antenna whereas another type of antenna is used in forming a remote wireless link antenna. If desired, space may be conserved within device 10 by using a single antenna to handle two or more different communications bands. For example, a single antenna in device 10 may be used to handle communications in a WiFi® or Bluetooth® communication band while also handling communications at one or more cellular telephone frequencies. In some configurations, some cellular telephone communications (e.g., low-band and mid-band communications) may be handled using a first antenna (e.g., an inverted-F antenna), whereas other communications (e.g., high-band cellular communications) may be handled using one or more phased antenna arrays (e.g., multiple linear patch antenna arrays each of which is mounted in a different orientation and each of which has a different angle of view so that a desired amount of angular coverage is achieved).

To provide antenna structures in device 10 with the ability to cover different frequencies of interest, one or more of the antennas of device 10 may be provided with circuitry such as filter circuitry (e.g., one or more passive filters and/or one or more tunable filter circuits). Discrete components such as capacitors, inductors, and resistors may be incorporated into the filter circuitry. Capacitive structures, inductive structures, and resistive structures may also be formed from patterned metal structures (e.g., part of an antenna). If desired, antenna(s) in device 10 may be provided with adjustable circuits such as tunable components that tune the antenna over communications (frequency) bands of interest. The tunable components may be part of a tunable filter or tunable impedance matching network, may be part of an antenna resonating element, may span a gap between an antenna resonating element and antenna ground, etc.

Radio-frequency transmission line paths may be used to convey antenna signals between the radio-frequency transceiver circuitry of device 10 and the antenna(s) of device 10. These paths may include one or more radio-frequency transmission lines (sometimes referred to herein as transmission lines). Radio-frequency transmission line paths may each include a positive signal conductor and a ground signal conductor. Transmission lines in device 10 may include coaxial cable transmission lines, stripline transmission lines, microstrip transmission lines, edge-coupled microstrip transmission lines, edge-coupled stripline transmission lines, transmission lines formed from waveguide structures (e.g., coplanar waveguides or grounded coplanar waveguides), combinations of these types of transmission lines and/or other transmission line structures.

If desired, matching networks may be used to help match impedances in the wireless circuitry of device 10. A matching network may, for example, include components such as inductors, resistors, and capacitors configured to match the impedance of an antenna to the impedance of an associated radio-frequency transmission line path that is used in coupling the antenna to a transceiver. Matching network components may be provided as discrete components (e.g., surface mount technology components) or may be formed from housing structures, printed circuit board structures, traces on plastic supports, etc. Components such as these may also be used in forming antenna filter circuitry and may be tunable and/or fixed components.

Radio-frequency transmission line paths may be coupled to antenna feed structures associated with antennas in device 10. As an example, an antenna in device 10 such as an inverted-F antenna, a planar inverted-F antenna, a patch antenna, a loop antenna, or other antenna may have an antenna feed with a positive antenna feed terminal and a ground antenna feed terminal. The positive antenna feed terminal may be coupled to an antenna resonating (radiating) element within the antenna. The ground antenna feed terminal may be coupled to an antenna ground in the antenna. The positive feed terminal may be coupled to a positive signal line in a transmission line and the ground feed terminal may be coupled to a ground signal line in the transmission line.

Other types of antenna feed arrangements may be used if desired. For example, an antenna may be fed using multiple feeds each coupled to a respective port of a transceiver over a corresponding transmission line. If desired, a given transmission line signal conductor may be coupled to multiple locations on an antenna and/or switches may be interposed within the paths between a transceiver and the feed terminals of an antenna.

Figure 2:
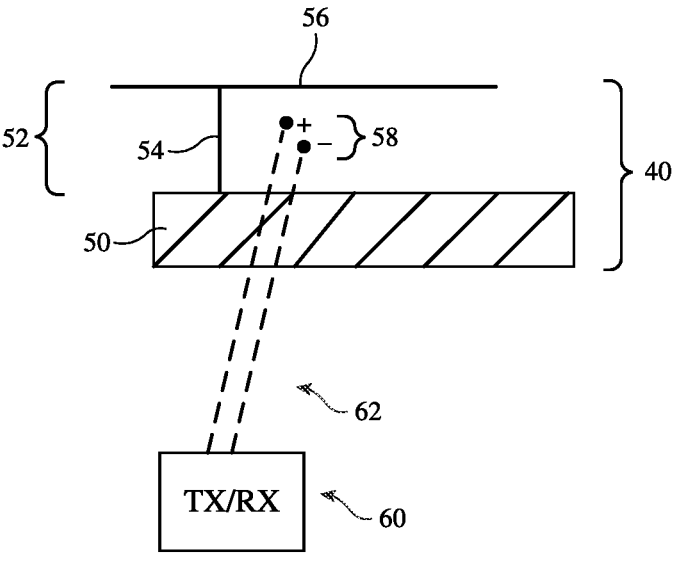
FIG. 2 is a diagram of an illustrative antenna for an electronic device in accordance with an embodiment.

FIG. 2 is a diagram of illustrative wireless communications circuitry for device 10. As shown in FIG. 2, the wireless circuitry includes radio-frequency transceiver 60, which is coupled to antenna 40 by transmission line 62. Antenna 40 may have an antenna resonating element 52 (sometimes referred to as an antenna resonating structure or antenna resonator) and antenna ground 50. Antenna resonating element 52 may be formed from any suitable antenna resonating element structures. In the example of FIG. 2, antenna resonating element 52 is an inverted-F antenna resonating element having resonating element arm 56, which is coupled to ground 50 by return path 54 and which is fed using antenna feed 58. Feed 58 has positive and ground feed terminals coupled respectively to positive and ground signal lines in transmission line 62. Conductive structures making up antenna 40 may be formed from thin-film metal traces on printed circuits (e.g., flexible printed circuits formed from sheets of polyimide or other flexible polymer substrates). If desired, the conductive structures making up antenna 40 (e.g., ground structures for antenna 40) may include conductive structural members such as portions of a housing for device 10 (e.g., a metal chassis and/or other internal and/or external frame structures, metal housing walls, metal component support brackets, and/or other conductive housing structures), and/or other structures in device 10 that are formed from metal and/or other conductive material.

Antennas may be mounted within device 10 using mounting brackets, using biasing structures that press antenna components against housing structures, using adhesive, using screws and other fasteners, using press-fit connections, using solder, welds, conductive adhesive, and/or other conductive attachment mechanisms, using one or more frames, carriers, and/or other internal support structures, and/or other mounting arrangements. In some configurations, such as when an antenna in device 10 is mounted adjacent to the inner surface of edge portion E of display cover layer 12CG or other overlapping dielectric layer (e.g., one or more overlapping polymer layers), it may be desirable to provide antenna 40 and any associated support structures (e.g., polymer carriers or other polymer layers, housing frame structures, etc.) with compound curvature. By matching the compound curvature of the substrate of antenna 40 to the compound curvature of an associated overlapping dielectric layer such as polymer layer that serves as a cover or support structure and/or the compound curvature of adjacent housing portions such as layer 12CG, antenna 40 may be configured to fit within the potentially tight confines of device 10 without adversely affecting the shape and appearance of device 10. As an example, by matching the compound curvature of the substrate of antenna 40 to the compound curvature of an overlapping dielectric structure, antenna 40 can be attached to an inner surface or other surface of compound curvature on the overlapping dielectric structure (e.g., by adhesive).

Figure 3:
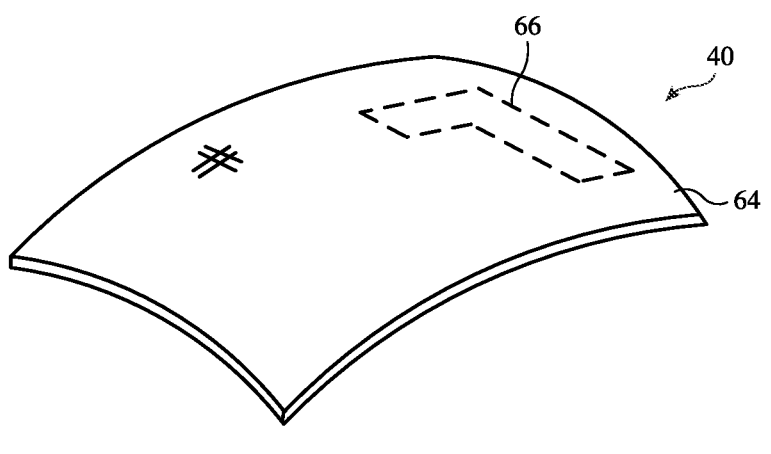
FIG. 3 is a perspective view of an illustrative flexible printed circuit antenna with compound curvature in accordance with an embodiment.

Consider, as an example, the illustrative antenna structures of FIG. 3. As shown in FIG. 3, antenna 40 may be formed from antenna substrate 64. Substrate 64 may be formed from a flexible printed circuit with a surface of compound curvature (sometimes referred to as a non-developable surface). Antenna substrate 64 contains metal traces such as metal trace 66 (e.g., a patterned thin-film metal layer). Trace 66 is patterned to form antenna resonating element 52 (FIG. 2) and/or other antenna structures. Antenna 40 of FIG. 3 has been contoured in a contouring tool to produce a desired three-dimensional shape with compound curvature. At least some portions of the curved surface of substrate 64 may be characterized by a radius of curvature R of 4 mm to 250 mm, 8 mm to 200 mm, 10 mm to 150 mm, at least 5 mm, at least 12 mm, at least 16 mm, at least 20 mm, at least 30 mm, less than 200 mm, less than 100 mm, less than 75 mm, less than 55 mm, less than 35 mm, and/or other suitable amount of curvature.

Figure 4:
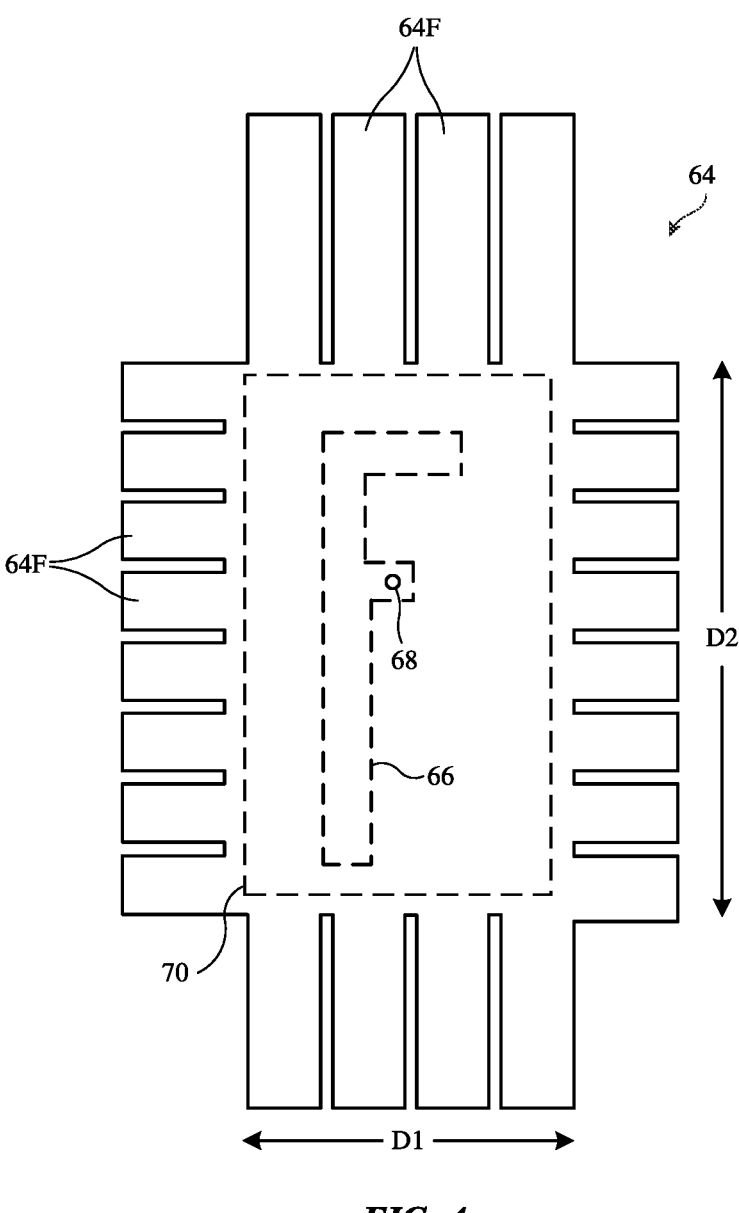
FIG. 4 is a top view of an illustrative flexible printed circuit antenna prior to forming the antenna into a shape with compound curvature in accordance with an embodiment.

FIG. 4 is a top view of substrate 64 before contouring. In the illustrative configuration of FIG. 4, central area 70 of substrate 64 has a rectangular shape. Protruding substrate fingers 64F extend outwardly from the four edges of area 70. During contouring, the slits between adjacent fingers 64F help accommodate movement of the substrate and thereby help prevent wrinkling of substrate 64. Metal antenna trace (s) 66 may be formed in substrate 64 prior to contouring. Openings such as opening 68 may be formed by laser etching or other processing techniques (e.g., to form exposed solder contacts on trace 66, etc.). In the example of FIG. 4, substrate 64 (e.g., the central portion of substrate 64 in area 70) has unequal lateral dimensions (e.g., D1 is less than D2). To help prevent wrinkling at the corners and/or other portions of substrate 64 when contouring substrate 64, substrate 64 may be contoured using a contouring tool with peripheral lateral flow-control structures.

Figure 5:
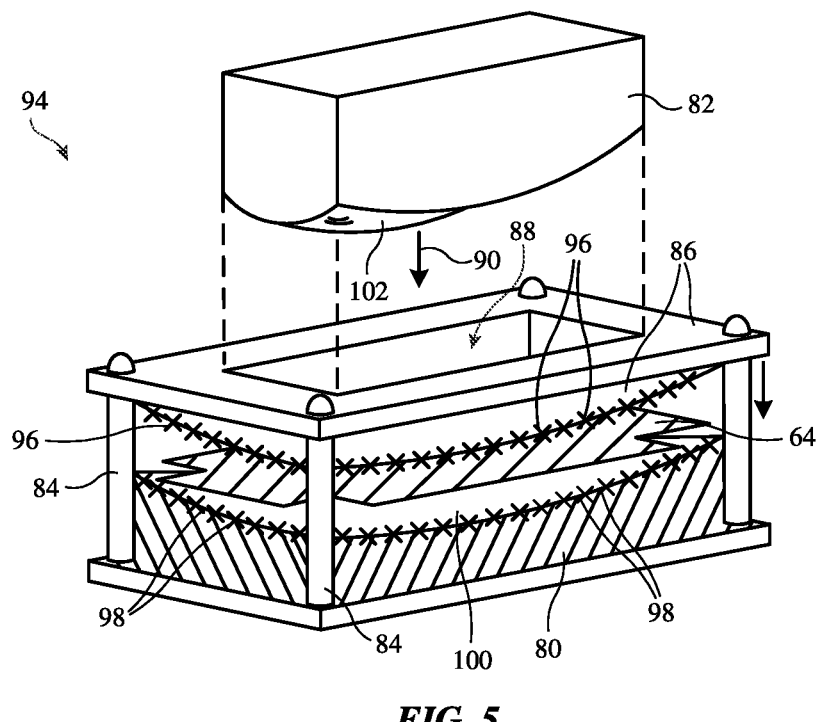
FIG. 5 is a diagram of an illustrative tool for forming a planar antenna substrate into a three-dimensional shape in accordance with an embodiment.

Consider, as an example, illustrative contouring tool 94 of FIG. 5. As shown in FIG. 5, a sheet of flexible printed circuit material (planar substrate 64) may be placed between a lower die with a concave surface (lower die 80 with concave surface 100) and a corresponding movable upper die with a matching convex surface (upper die 82 with convex surface 102). Ring-shaped frame 86 is slidably coupled to vertical poles 84. This allows frame 86 to be slidably positioned so that upper lateral flow control structures 96 press on the top of the peripheral portions of substrate 64 (e.g., along the dashed line associated with central area 70 of FIG. 4). As a result of downward pressure from structures 96, these peripheral portions of substrate 64 are compressed between the upper lateral flow control structures 96 and corresponding mating lower lateral flow control structures 98 along the periphery of lower die 80. Rectangular opening 88 in frame 86 is sized to thereafter receive and guide upper die 82 so that upper die 82 can be moved downwards through frame 86 in direction 90. When convex surface 102 of upper die 82 presses against substrate 64, substrate 64 is deformed and thereby stretched into a desired three-dimensional shape defined by the shapes of the convex and concave surfaces of dies 82 and 80.

During contouring, the edges of substrate 64 that are captured by the flow control structures are pulled inwards through the flow control structures as substrate 64 is stretched to accommodate the larger surface area needed to achieve its desired three-dimensional shape. The presence of the lateral flow control structures formed by sandwiching substrate 64 between structures 96 and 98 ensures that lateral inward flow of printed circuit material (e.g., peripheral portions of substrate 64) is controlled as a function of distance around the periphery of substrate 64 to prevent wrinkles as substrate 64 is contoured. The lateral flow-control structures may, as an example, be configured to permit different amounts of inward flow of substrate 64 at different peripheral locations.

Consider, as an example, substrate 64 of FIG. 4. In this example, dimension D1 (which may be, for example, at least 3 mm, at least 7 mm, at least 9 mm, 5-15 mm, less than 30 mm, less than 20 mm, or other suitable size), may be less than dimension D2 (which may be, for example, at least 6 m, at least 14 mm, at least 18 mm, 10-30 mm, less than 60 mm, less than 40 mm, or other suitable size). In the final desired contoured shape for antenna 40, substrate 64 may exhibit more curvature and therefore a smaller radius of curvature across the shorter lateral dimension (D1) than along the longer lateral dimension (D2), where a larger radius of curvature may be exhibited. With this type of shape, wrinkles may be prevented by restricting the lateral inward flow of substrate material along the longer edges by less than the shorter edges. This allows more material to be made available for stretching substrate 64 where needed (e.g., to achieve the greater amount of curvature needed along the shorter lateral dimension).

Figure 6:
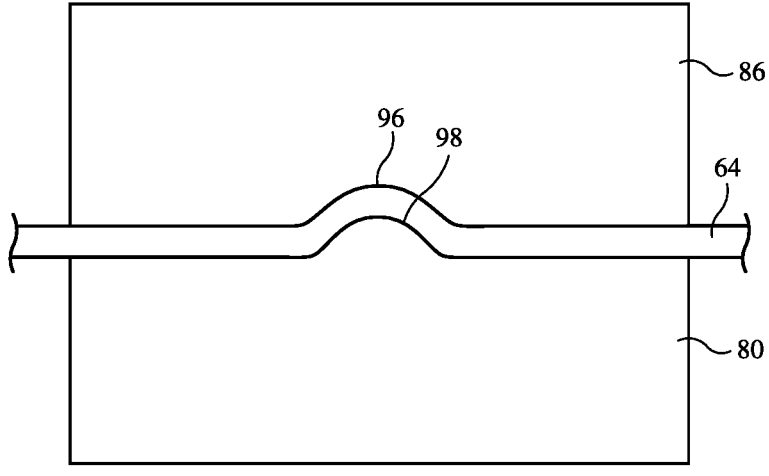
FIGS. 6 and 7 show illustrative flow regulation structures that may be formed around a peripheral edge portion of the tool of FIG. 5 in accordance with an embodiment.
Figure 7:
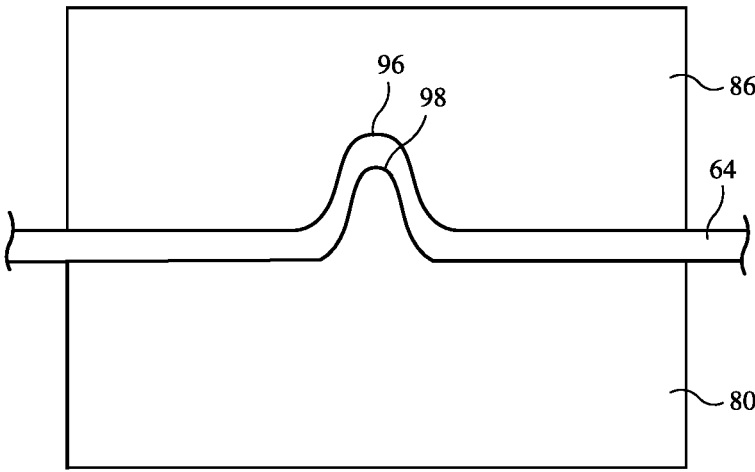

Cross-sectional side views of illustrative lateral flow control structures are shown in FIGS. 6 and 7. As shown in FIG. 6, lateral flow control structures for contouring tool 94 may include upper structures 96 (e.g., a groove running along the edge of frame 86) and lower structures 98 (e.g., a mating rib-shaped protrusion on die). When frame 86 and lower die 80 are pressed together, the rib of structures 98 moves upwards towards the mating groove of structures 96. This creates a pathway for substrate 64 that restricts lateral movement (e.g., the pathway restricts inward lateral flow of substrate material due to the downward stretching of substrate 64 when pressed by convex surface 102 of upper die 82). The illustrative flow control structures of FIG. 6 may be used along the longer edges of substrate 64. To prevent wrinkling in the present example, more lateral flow restriction may be provided to substrate 64 along the shorter edges of substrate 64 (e.g., using more restrictive flow control structures such as these structures of FIG. 7 in which the depth of the groove in structures 96 is larger than in FIG. 6 and in which the height of the mating rib in structures 98 is larger than in FIG. 6).

If desired, the depths of the grooves and the heights of the mating ribs and/or other lateral substrate flow control structures may be varied continuously (or in a stepwise fashion) about the entire perimeter of substrate 64 and tool 94 (e.g., more or less flow control may be provided in corner regions, along different portions of an edge, etc.). In this way, the lateral flow of substrate material towards the center of tool 94 may be controlled during contouring operations to ensure that a desired contour is provided for antenna 40 without undesired artifacts (e.g., without bumps from substrate buckling during contouring, etc.). In an illustrative configuration, antenna 40 is shaped into a desired shape while exhibiting no visibly discernable wrinkles and/or wrinkles of less than 0.1 mm in height, less than 0.05 mm in height, or less than 0.02 mm in height (as examples).

Figure 8:
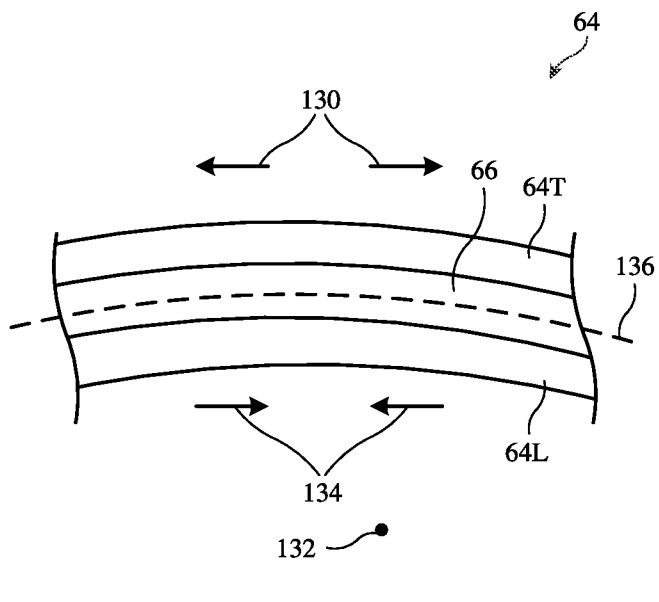
FIG. 8 is a cross-sectional side view of a portion of an illustrative antenna in accordance with an embodiment.

If desired, stress in metal traces 66 may be maintained at an acceptably low level by aligning the neutral stress plane of substrate 64 with traces 66. This is shown in the illustrative cross-sectional side view of substrate 64 (following contouring) of FIG. 8. As shown in FIG. 8, during contouring, substrate 64 may be deformed to exhibit curvature about bend axis 132. Substrate 64 may include one or more polyimide layers or other polymer layers such as illustrative upper layer(s) 64T and illustrative lower layer(s) 64L. Metal traces 66 may be formed from a patterned thin-film metal layer between layers 64T and 64L. Due to deformation about bend axis 132, upper layer 64T experiences tensile stress (see, e.g., stress 130) and lower layer 64T experiences compressive stress (see, e.g., stress 134). By selection of appropriate thicknesses and materials properties (e.g., elastic modulus values) for layers 64T and 64L, a plane (curved in this example) at which the compressive stress and tensile stress balance each other (e.g., neutral stress plane 136) may be aligned with the layer of metal traces 66. This helps ensure that no undue stress from contouring substrate 64 is imparted onto traces 66 and thereby helps to enhance antenna reliability.

Although sometimes described in the context of using tool 94 to contour flexible printed circuit substrates to form antennas with compound curvature, other types of electronic device structures may be produced using tool 94 if desired. For example, substrate 64 may have an array of pads or other capacitive sensor electrodes formed from traces 66, may have strain gauge structures formed from traces 66, may have signal busses formed from signal lines in traces 66, and/or may have other circuitry formed from traces 66 in a contoured flexible printed circuit. Contoured flexible printed circuits such as these may be used as sensors in automobiles, robots, portable electronic devices, accessories, wearable devices such as head-mounted devices, and/or other electronic devices. The use of a contoured flexible printed circuit to form antenna 40 for a device such as a head-mounted device is illustrative In some embodiments, sensors may gather personal user information. To ensure that the privacy of users is preserved, all applicable privacy regulations should be met or exceeded and best practices for handling of personal user information should be followed. Users may be permitted to control the use of their personal information in accordance with their preferences.

In accordance with an embodiment, an electronic device is provided that includes a housing, and an antenna mounted in the housing, the antenna includes a flexible printed circuit that has a flexible printed circuit substrate layer with a surface having compound curvature and that has an antenna resonator formed from a metal trace in the flexible printed circuit substrate layer.

In accordance with another embodiment, the electronic device includes a radio-frequency transceiver configured to transmit and receive wireless signals using the antenna, the housing includes a dielectric layer overlapping the antenna, and the metal trace is configured to form an inverted-F antenna resonator.

In accordance with another embodiment, the electronic device includes a display that is overlapped by the dielectric layer.

In accordance with another embodiment, the housing includes a head-mounted housing and the dielectric layer includes a layer that is at least partly transparent.

In accordance with another embodiment, the dielectric layer has an area of compound curvature and the antenna is overlapped by the area of compound curvature.

In accordance with another embodiment, the housing has a dielectric layer with compound curvature adjacent to the antenna.

In accordance with another embodiment, the flexible printed circuit substrate layer has an upper polymer layer and a lower polymer layer and the metal trace is between the upper polymer layer and the lower polymer layer.

In accordance with another embodiment, the flexible printed circuit substrate layer has a neutral stress plane aligned with the metal trace.

In accordance with another embodiment, the housing includes a head-mounted housing having a portion with a curved cross-sectional profile and the antenna is overlapped by the portion.

In accordance with an embodiment, a head-mounted device is provided that includes a head-mounted housing, optical assemblies in the head-mounted housing that are configured to display images in eye boxes, and an antenna in the housing that includes a flexible printed circuit having a flexible printed circuit substrate layer with a surface of compound curvature and an antenna resonator formed from a metal trace in the flexible printed circuit substrate layer.

In accordance with another embodiment, the flexible printed circuit substrate layer includes first and second polymer layers and the metal trace is between the first and second polymer layers.

In accordance with another embodiment, the flexible printed circuit substrate layer has a neutral stress plane aligned with the metal trace.

In accordance with another embodiment, the head-mounted device includes a display that faces away from the eye boxes, the head-mounted housing includes a dielectric layer that overlaps the display.

In accordance with another embodiment, the dielectric layer has a portion that overlaps the antenna.

In accordance with another embodiment, the portion that overlaps the antenna has a curved cross-sectional profile.

In accordance with an embodiment, an electronic device is provided that includes a housing, and a flexible printed circuit in the housing, the flexible printed circuit includes polymer layers having surfaces with compound curvature and a metal trace between the polymer layers.

In accordance with another embodiment, the metal trace forms an antenna resonator.

In accordance with another embodiment, the metal trace is a capacitive sensor electrode.

In accordance with another embodiment, the housing includes a head-mounted housing.

In accordance with another embodiment, the polymer layers are configured to place a neutral stress plane in alignment with the metal trace.

The foregoing is merely illustrative and various modifications can be made to the described embodiments. The foregoing embodiments may be implemented individually or in any combination.

What is claimed is:

1. An electronic device, comprising:
a housing; and
an antenna mounted in the housing, wherein the antenna comprises a flexible printed circuit that has a flexible printed circuit substrate layer with a surface having compound curvature and that has an antenna resonator formed from a metal trace in the flexible printed circuit substrate layer, wherein the housing comprises a head-mounted housing having a portion with a curved cross-sectional profile, and wherein the antenna is overlapped by the portion.

2. The electronic device defined in claim 1 further comprising:
a radio-frequency transceiver configured to transmit and receive wireless signals using the antenna, wherein the portion of the head-mounted housing comprises a dielectric layer overlapping the antenna, and wherein the metal trace is configured to form an inverted-F antenna resonator.

3. The electronic device defined in claim 2 further comprising a display that is overlapped by the dielectric layer.

4. The electronic device defined in claim 3 wherein the dielectric layer comprises a layer that is at least partly transparent.

5. The electronic device defined in claim 4 wherein the dielectric layer has an area of compound curvature and wherein the antenna is overlapped by the area of compound curvature.

6. The electronic device defined in claim 1 wherein the portion of the head-mounted housing comprises a dielectric layer with compound curvature adjacent to the antenna.

7. The electronic device defined in claim 1 wherein the flexible printed circuit substrate layer has an upper polymer layer and a lower polymer layer and wherein the metal trace is between the upper polymer layer and the lower polymer layer.

8. The electronic device defined in claim 7 wherein the flexible printed circuit substrate layer has a neutral stress plane aligned with the metal trace.

9. A head-mounted device, comprising:
a head-mounted housing;
optical assemblies in the head-mounted housing that are configured to display images in eye boxes; and
an antenna in the housing that comprises a flexible printed circuit having a flexible printed circuit substrate layer with a surface of compound curvature and an antenna resonator formed from a metal trace in the flexible printed circuit substrate layer.

10. The head-mounted device defined in claim 9 wherein the flexible printed circuit substrate layer comprises first and second polymer layers and wherein the metal trace is between the first and second polymer layers.

11. The head-mounted device defined in claim 10 wherein the flexible printed circuit substrate layer has a neutral stress plane aligned with the metal trace.

12. The head-mounted device defined in claim 9 further comprising a display that faces away from the eye boxes, wherein the head-mounted housing comprises a dielectric layer that overlaps the display.

13. The head-mounted device defined in claim 12 wherein the dielectric layer has a portion that overlaps the antenna.

14. The head-mounted device defined in claim 13 wherein the portion that overlaps the antenna has a curved cross-sectional profile.

15. The head-mounted device defined in claim 9 further comprising:
a display, wherein the head-mounted housing comprises a dielectric layer overlapping the antenna and the display.

16. An electronic device, comprising:
a housing; and
a flexible printed circuit in the housing, wherein the flexible printed circuit comprises polymer layers having surfaces with compound curvature and a metal trace between the polymer layers.

17. The electronic device defined in claim 16 wherein the metal trace forms an antenna resonator.

18. The electronic device defined in claim 16 wherein the metal trace is a capacitive sensor electrode.

19. The electronic device defined in claim 16 wherein the housing comprises a head-mounted housing.

20. The electronic device defined in claim 16 wherein the polymer layers are configured to place a neutral stress plane in alignment with the metal trace.

* * * * *